(12) United States Patent
Senapati et al.

(10) Patent No.: US 12,148,682 B2
(45) Date of Patent: Nov. 19, 2024

(54) MEMORY CELL IN WAFER BACKSIDE

(71) Applicant: International Business Machines Corporation, Armonk, NY (US)

(72) Inventors: Biswanath Senapati, Mechanicville, NY (US); Seiji Munetoh, Kawasaki (JP); Nicholas Anthony Lanzillo, Wynantskill, NY (US); Lawrence A. Clevenger, Saratoga Springs, NY (US); Geoffrey Burr, Cupertino, CA (US); Kohji Hosokawa, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 17/551,457

(22) Filed: Dec. 15, 2021

(65) Prior Publication Data
US 2023/0187314 A1 Jun. 15, 2023

(51) Int. Cl.
| | | |
|---|---|---|
| *G11C 13/00* | (2006.01) | |
| *H01L 21/768* | (2006.01) | |
| *H01L 23/48* | (2006.01) | |
| *H01L 23/532* | (2006.01) | |
| *H10B 63/00* | (2023.01) | |

(52) U.S. Cl.
CPC ........ *H01L 23/481* (2013.01); *G11C 13/0004* (2013.01); *G11C 13/0038* (2013.01); *H01L 21/76898* (2013.01); *H01L 23/53209* (2013.01); *H01L 23/53242* (2013.01); *H01L 23/53257* (2013.01); *H10B 63/80* (2023.02)

(58) Field of Classification Search
CPC ............. H01L 21/76898; H01L 23/481; G11C 13/0004

USPC .......................................................... 365/63
See application file for complete search history.

(56) References Cited

U.S. PATENT DOCUMENTS

| | | |
|---|---|---|
| 6,355,950 B1 | 3/2002 | Livengood et al. |
| 9,331,062 B1 | 5/2016 | Lane et al. |
| 10,319,908 B2 | 6/2019 | Narayanan et al. |
| 11,068,161 B1 | 7/2021 | Chen et al. |
| 2010/0252934 A1 | 10/2010 | Law et al. |
| 2014/0035158 A1* | 2/2014 | Chang ..................... H01L 24/08 438/109 |

(Continued)

FOREIGN PATENT DOCUMENTS

WO     2016195664 A1    12/2016

OTHER PUBLICATIONS

Zhu, Y., et al., "A Wafer Level Through-Stack-Via Integration Process with One-time Bottom-up Copper Filling", 2014 Electronic Components & Technology Conference, May 2014, pp. 1902-1907.

*Primary Examiner* — Anthan Tran
(74) *Attorney, Agent, or Firm* — Scully, Scott, Murphy & Presser, P.C.; Daniel Morris (57) ABSTRACT

A memory cell in a backside of a wafer and methods of forming the memory cell are described. A buried metal structure can be formed through a frontside of a substrate. At least one device can be formed on the frontside of a substrate, where the at least one device can be connected to the buried metal structure in the substrate. A through silicon via (TSV) can be formed through a backside of the substrate, where the TSV can be connected to the buried metal structure. A memory cell can be formed on the backside of the substrate, where the memory cell can be connected to the TSV.

7 Claims, 10 Drawing Sheets

(56) References Cited

U.S. PATENT DOCUMENTS

| | | | |
|---|---|---|---|
| 2014/0246782 A1* | 9/2014 | Kim | H01L 23/481 |
| | | | 257/774 |
| 2015/0108605 A1* | 4/2015 | Park | H10B 12/50 |
| | | | 257/532 |
| 2015/0332966 A1 | 11/2015 | Maling et al. | |
| 2018/0145030 A1 | 5/2018 | Beyne et al. | |
| 2020/0006627 A1* | 1/2020 | Manipatruni | H10B 61/22 |
| 2020/0279850 A1 | 9/2020 | Sharma et al. | |
| 2020/0395307 A1 | 12/2020 | Howell et al. | |
| 2021/0202317 A1 | 7/2021 | Wang | |
| 2022/0308995 A1* | 9/2022 | Gomes | G11C 11/4093 |
| 2023/0009553 A1* | 1/2023 | Yu | H01L 25/0657 |

* cited by examiner

MEMORY CELL IN WAFER BACKSIDE

BACKGROUND

The present disclosure relates in general to semiconductor devices and methods of manufacturing semiconductor devices and, in particular, to formation of memory cells in wafer backside.

Memory cells can be formed on top of a plurality of metal interconnects and metal layers, and these metal interconnects and metal layers can be deposited on top of logic devices such as transistors. As the number of interconnect and metal layers between the memory cell and the logic devices increases, the time and distance for routing signals between the memory cell and the logic devices can increase. Further, as the number of interconnect and metal layers between the memory cell and the logic devices increases, a resistance of the overall stack can also increase and slow down the signal routing.

SUMMARY

In one embodiment, a semiconductor structure is generally described. The semiconductor structure can include a substrate and a memory cell formed on a backside of the substrate. The substrate can include a buried metal structure connected to at least one device formed on a frontside of the substrate. The substrate can further include a through silicon via (TSV) connected to the buried metal structure and the memory cell formed on the backside of the substrate.

In one embodiment, a method for forming a memory cell is generally described. The method can include forming a buried metal structure through a frontside of a substrate. The method can further include forming at least one device on the frontside of a substrate, where the at least one device can be connected to the buried metal structure in the substrate. The method can further include forming a through silicon via (TSV) through a backside of the substrate, where the TSV can be connected to the buried metal structure. The method can further include forming a memory cell on the backside of the substrate, where the memory cell can be connected to the TSV.

In one embodiment, a memory device is generally described. The memory device an include a control circuit including a power delivery network formed on a backside of a substrate. The memory device can further include a memory block formed on the backside of the substrate. The memory block can be connected to the control circuit through a set of backside metal layers formed on the backside of the substrate.

Further features as well as the structure and operation of various embodiments are described in detail below with reference to the accompanying drawings. In the drawings, like reference numbers indicate identical or functionally similar elements.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following descriptions, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The methods described herein can provide a structure and method for forming a memory cell in a backside of a wafer. Logic devices such as transistors can be formed on a frontside of the wafer. Buried metal structures and through silicon via (TSV) can be inserted into the wafer to connect the memory cell on the backside of the wafer to the logic devices on the frontside of the wafer. By having the memory cell formed on the backside of the wafer, the routing distance between the memory cell and the logic devices (e.g., transistors) can be reduced when compared to other devices that have the memory cell formed on top of the logic devices on the wafer frontside. Further, a number of metal interconnect layers between the memory cell and the devices can be reduced since the buried metal structure and TSV can be used for current routing. In response to the reduced metal interconnect layers, the resistance between the memory cell and the logic devices can be decreased, and read and write operations can be improved (e.g., more efficient with decreased resistance to flowing current).

Figure 1A:
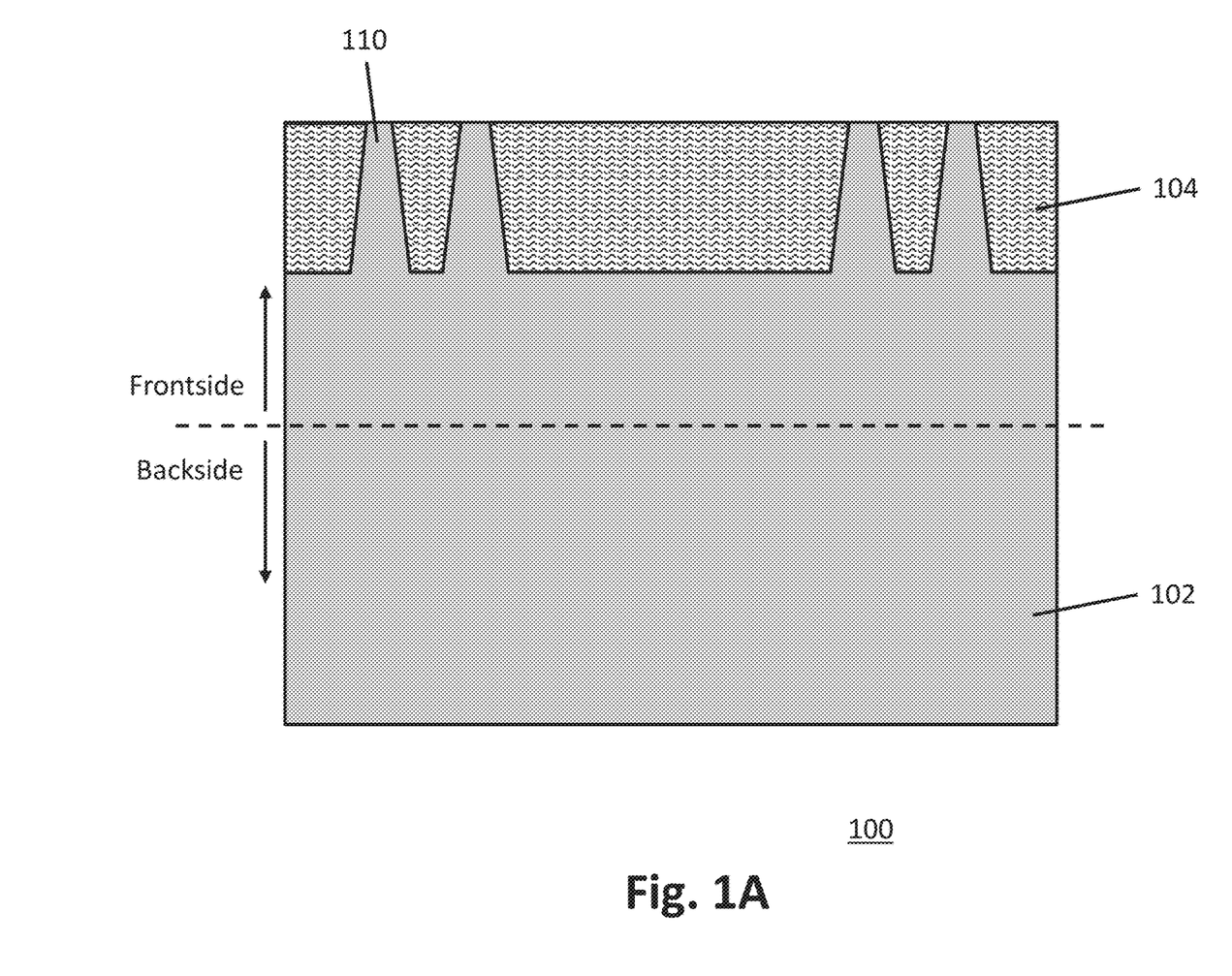
FIG. 1A is a cross sectional view of an exemplary structure that can be used for forming a device including a memory cell in wafer backside in one embodiment.

FIG. 1A is a cross sectional view of an exemplary structure 100 that can be used for forming a device including a memory cell in wafer backside in one embodiment. The structure 100 can be a deposition stack including a wafer or a substrate 102. A plurality of semiconductor fins 110 can be formed on a frontside of the substrate 102. In an embodiment, to form the fins 110, a shallow trench isolation (STI) process can be performed to etch a pattern of trenches in the substrate 102. One or more dielectric materials 104 can be deposited to fill the trenches, and excess dielectric materials can be removed using techniques such as chemical-mechanical planarization. The dielectric materials 104 can be, for example, silicon dioxide. The STI process can prevent electric current leakage between adjacent devices, such as transistors that can be formed using the fins 110. In one embodiment, the dielectric materials 104 can be deposited using a flowable oxide chemical vapor deposition (FCVD) process.

Figure 1B:
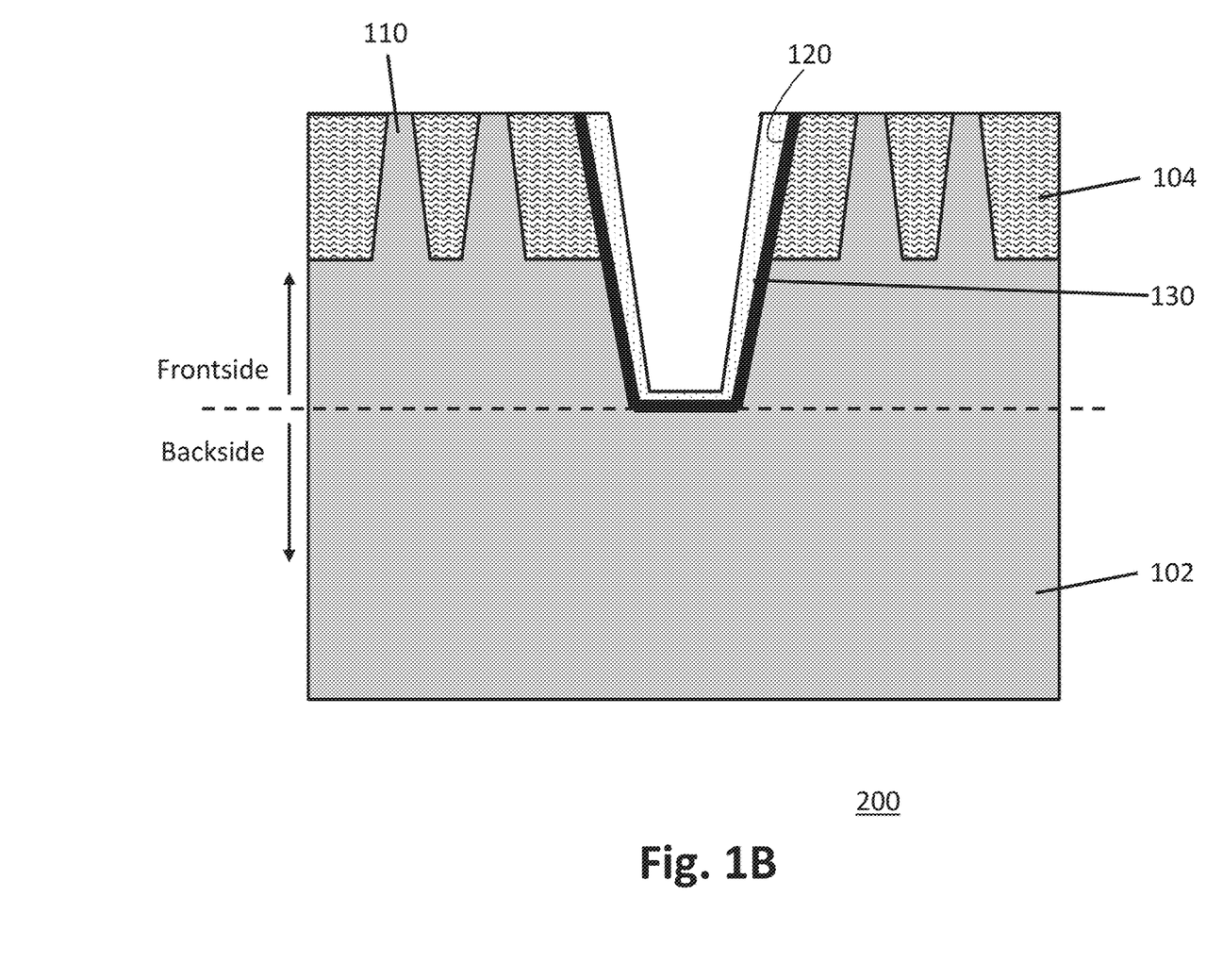
FIG. 1B is a cross sectional view of a structure formed after formation of a recess and deposition of a liner in the exemplary structure of FIG. 1A in one embodiment.

In one embodiment, an etching process can be performed to etch through the dielectric materials 104 to form a recess 120, as shown in FIG. 1B. A liner 130 can be deposited in the recess 120. The liner 130 can conform to surfaces of the recess 120. In one embodiment, the liner 130 can be a multi-layer liner composed of materials such as various types of oxides, silicon nitride (SiN), tantalum nitride (TaN), or other types of materials suitable for forming the liner 130.

Figure 2:
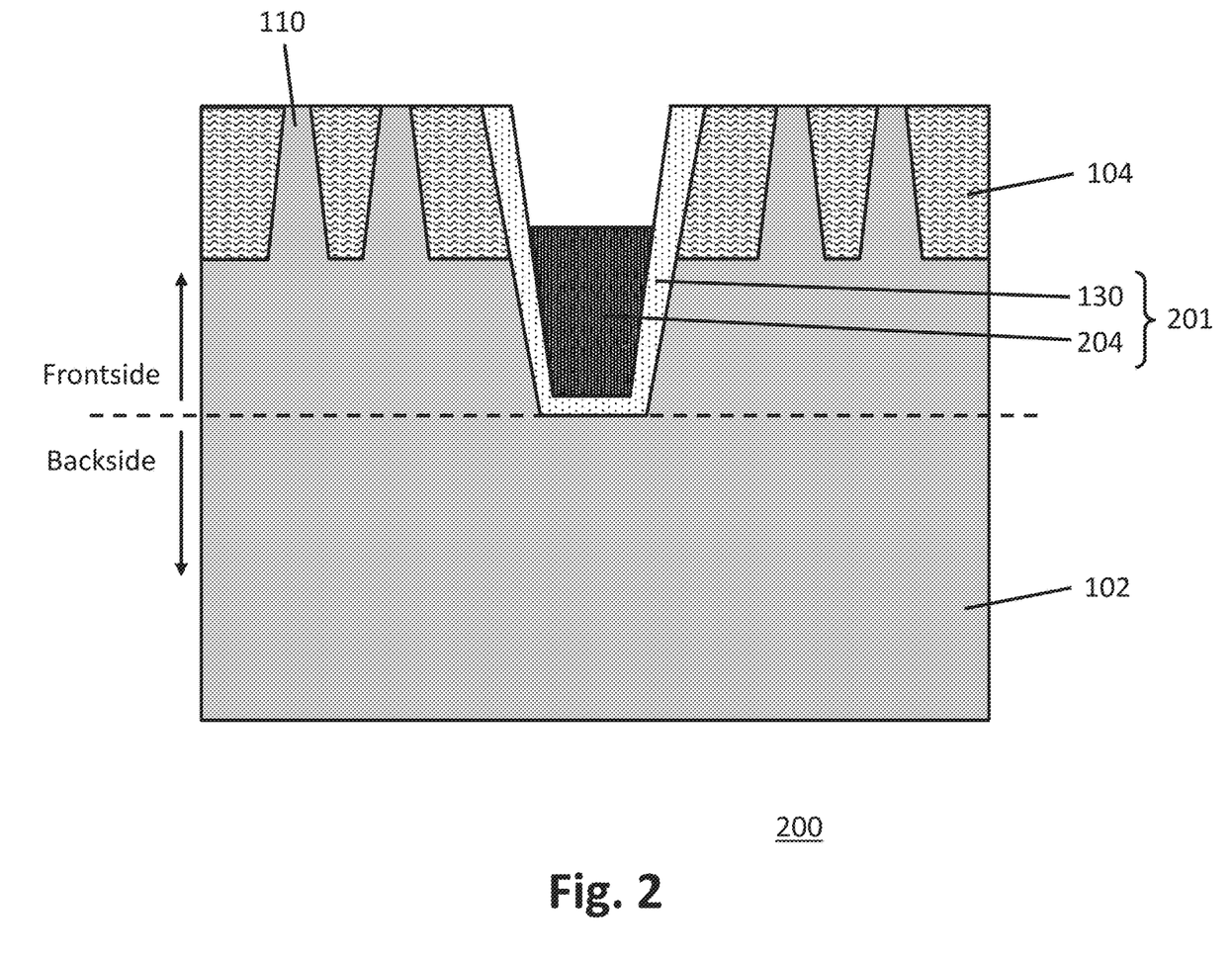
FIG. 2 is a cross sectional view of a structure formed after formation of a buried metal structure in the exemplary structure of FIG. 1B in one embodiment.

FIG. 2 is a cross sectional view of a structure 200 formed after formation of a buried metal structure in the exemplary structure of FIG. 1A in one embodiment. In one embodiment, the structure 100 in FIG. 1A can undergo a process to form a buried metal structure 201 in the substrate 102 and through the frontside of the substrate 102. The buried metal structure 201 can include buried metal 204 that can be conductive materials such as, for example, Cobalt (Co), Tungsten (W), Ruthenium (Ru), or other types of metal. In one embodiment, the buried metal structure 201 can further include a liner 130 coating the buried metal 204, where the liner 130 can be composed of conductive materials such as metal.

Figure 3:
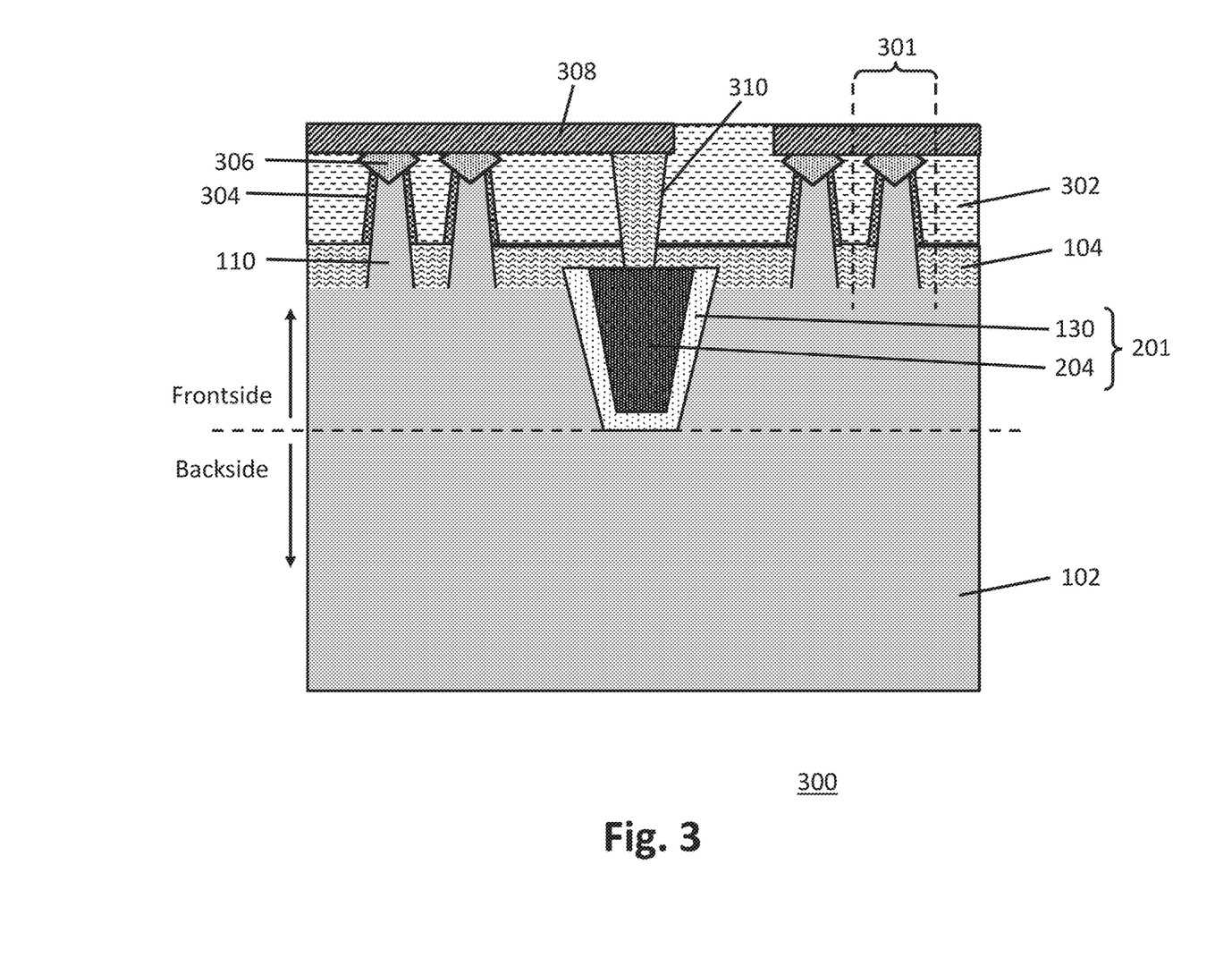
FIG. 3 is a cross sectional view of a structure 300 formed after performing front end of line (FEOL) and middle of line (MOL) processes on the exemplary structure of FIG. 2 in one embodiment.

FIG. 3 is a cross sectional view of a structure 300 formed after performing front end of line (FEOL) and middle of line (MOL) processes on the exemplary structure of FIG. 2 in one embodiment. In one embodiment, the structure 300 can be formed by performing FEOL and/or MOL processes to form FEOL devices (e.g., logic devices 301) and MOL contacts on the frontside of the structure 200 shown in FIG. 2. For example, a FEOL process can including thinning the layer of dielectric materials 104, depositing a layer of spacers 304 on the sidewalls of the fins 110, forming epitaxial structures 306 on each fin among the fins 110, and depositing another layer of dielectric materials 302. In one embodiment, dielectric materials 302 can be a silicon dioxide layer formed by a spin coating process. In one embodiment, prior to depositing the dielectric materials 104, a portion of the liner 130 can be removed to align with the buried metal 204. In one embodiment, the logic devices 301 can be fin field-effect transistors (finFETs). In an aspect, the spacers 304 can limit a size of the epitaxial structures 306. In one or more embodiments, the spacers 304 can be composed of materials such as a nitride (e.g., silicon nitride, silicon oxycarbonitride, and/or any other suitable nitride), boron silicide, and/or other materials suitable for forming a gate spacer structure. In one or more embodiments, the epitaxial structures 306 can be composed of materials such as epitaxially grown silicon, silicon germanium, and/or other suitable source or drain epitaxial materials. The MOL process can include forming an interconnect 310 that connects to the buried metal structure 201, and depositing one or more frontside metal layers 308 on the interconnect 310 and devices 301 formed on the frontside. The metal layers 308 and the interconnect 310 can be composed of conductive materials, such as Cobalt (Co), Tungsten (W), Ruthenium (Ru), or other metals. In one or more embodiments, other types of field-effect transistors (FET) or other types of logic devices can be formed on the frontside of the substrate 102.

Figure 4:
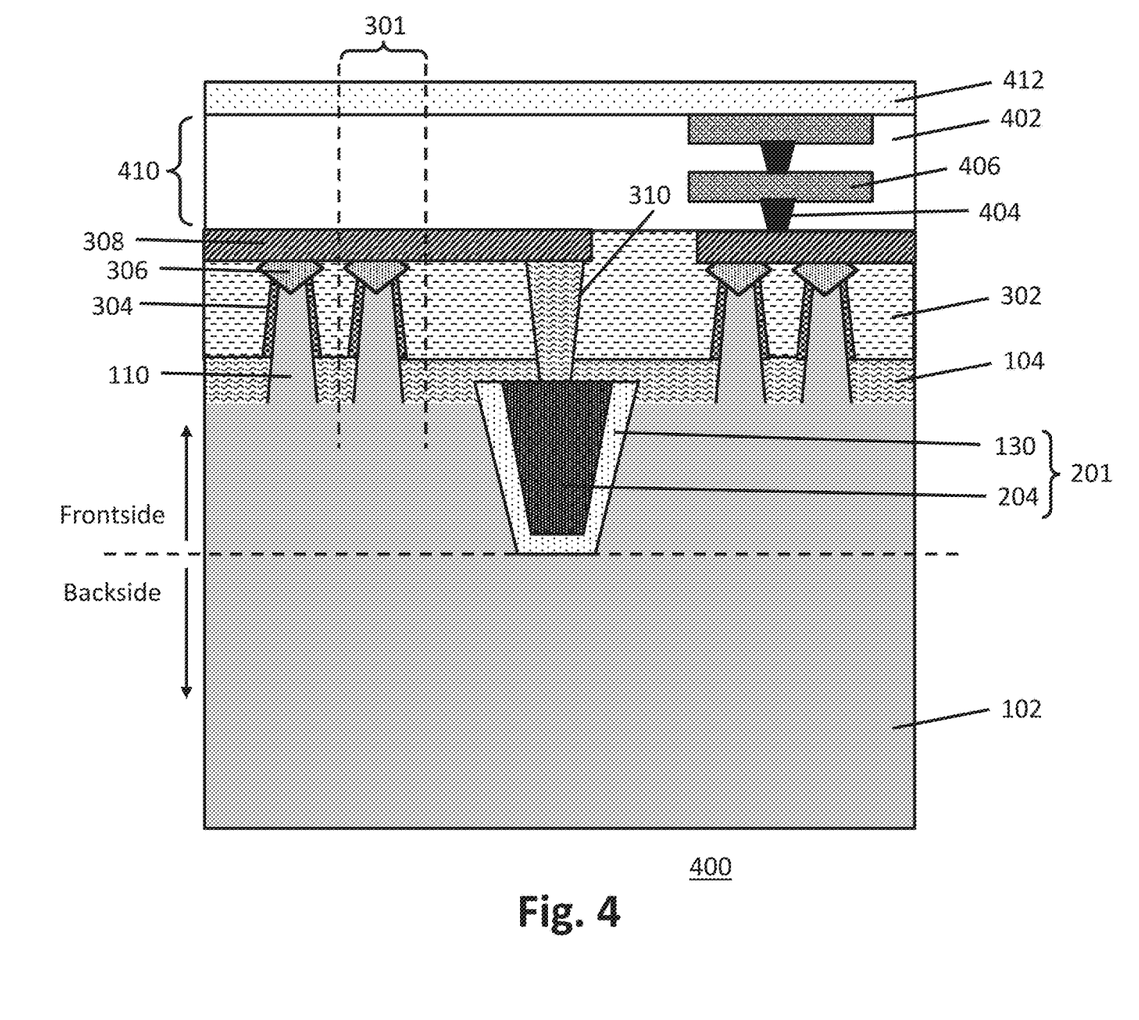
FIG. 4 is a cross sectional view of a structure formed after performing a back end of line (BEOL) process on a frontside of a substrate of the exemplary structure of FIG. 3 in one embodiment.

FIG. 4 is a cross sectional view of a structure formed after performing a back end of line (BEOL) process on a frontside of a substrate of the exemplary structure of FIG. 3 in one embodiment. In one embodiment, the structure 400 can be formed by performing a BEOL process to deposit one or more layers of dielectric materials 402, and to form metal interconnects 404 and metal layers 406 in the one or more layers of dielectric materials 402. The metal interconnects 404 and the metal layers 406 can be composed of, for example, copper, aluminum, or other metals suitable for BEOL contacts. The layers of dielectric materials 402 can be, for example, dielectric materials with low dielectric constant k (e.g., materials having dielectric constant k lower than the dielectric constant of silicon dioxide). In one or more embodiments, additional dielectrics, interconnects, and metal layers can be formed in a BEOL region 410 of the structure 400. In response to completing the formation of the BEOL region 410, a layer of coating 412 can be deposited on the BEOL region 410 of the structure 400. In one embodiment, the coating 412 can be a hard mask composed of silicon containing Bottom layer Anti-Reflective Coating (BARC).

Figure 5:
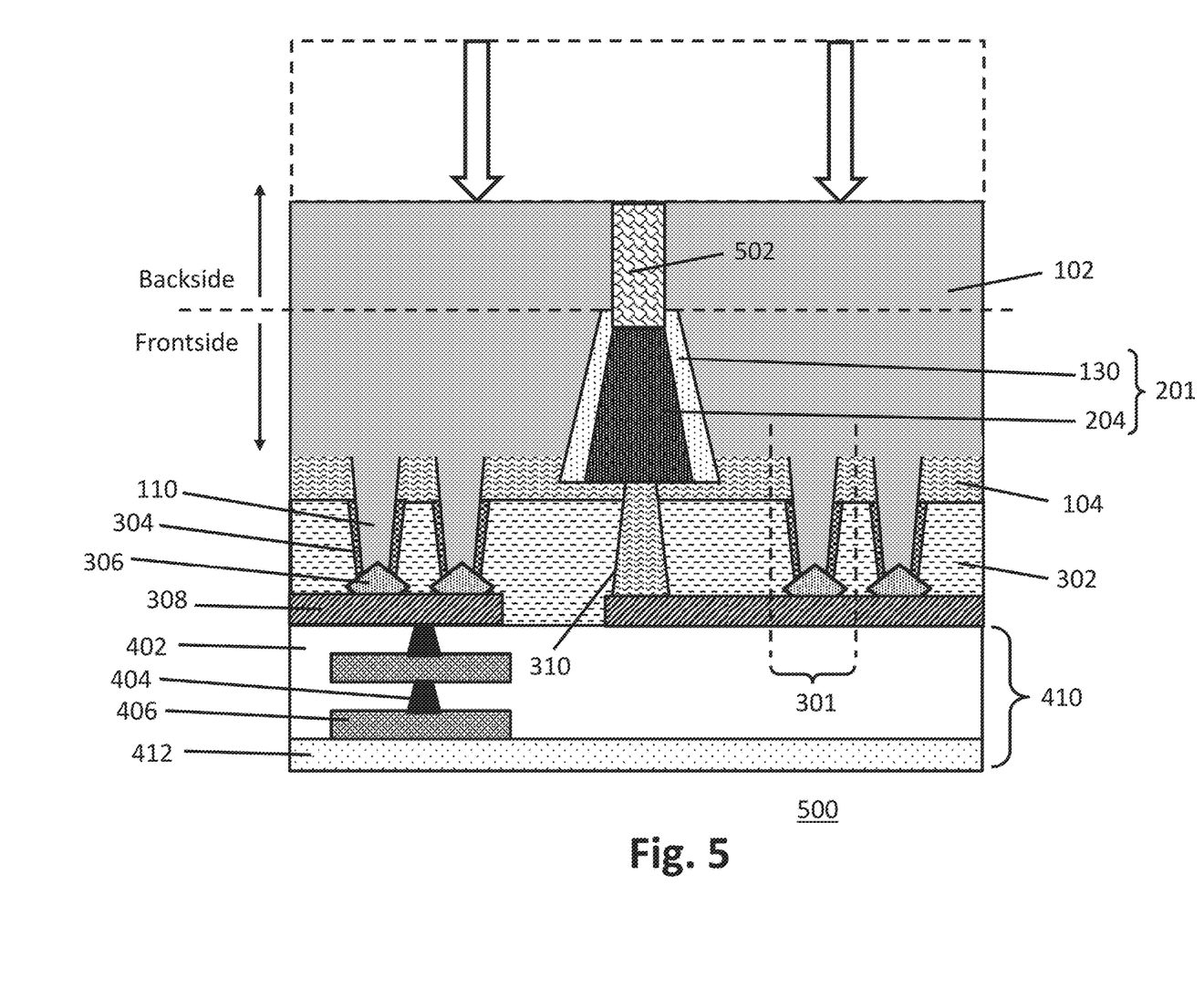
FIG. 5 is a cross sectional view of a structure 500 formed after forming a through silicon via (TSV) in a backside of a substrate of the exemplary structure of FIG. 4 in one embodiment.

FIG. 5 is a cross sectional view of a structure 500 formed after forming a through silicon via (TSV) in a backside of a substrate of the exemplary structure of FIG. 4 in one embodiment. In one embodiment, the structure 400 in FIG. 4 can be flipped upside-down in order to form various structures on a backside of the substrate 102. In response to flipping the structure 400 upside-down, a thinning process can be performed on the backside of the substrate 102 to adjust a thickness of the substrate 102 (or thickness of the backside of the substrate 102). The amount of adjustment being made to the thickness of the substrate 102 can be based on one or more factors such as wafer mechanical stability (e.g., mechanical stability of the substrate 102), thermal budget, height of TSV layer formation, and/or other factors and parameters. In one or more embodiments, a thickness of the backside of the substrate 102 can vary within a range of 100 nanometers (nm) to 300 nm. In response to a completion of the thinning process, a TSV 502 can be formed through the backside of the substrate 102. The TSV 502 can be connected to the buried metal structure 201. The TSV 502 can be composed of conductive materials such as, for example, copper. In one or more embodiments, the TSV 502 can be a nano-TSV having a diameter in nanometer scale, or a micro-TSV having a diameter in micrometer scale.

Figure 6:
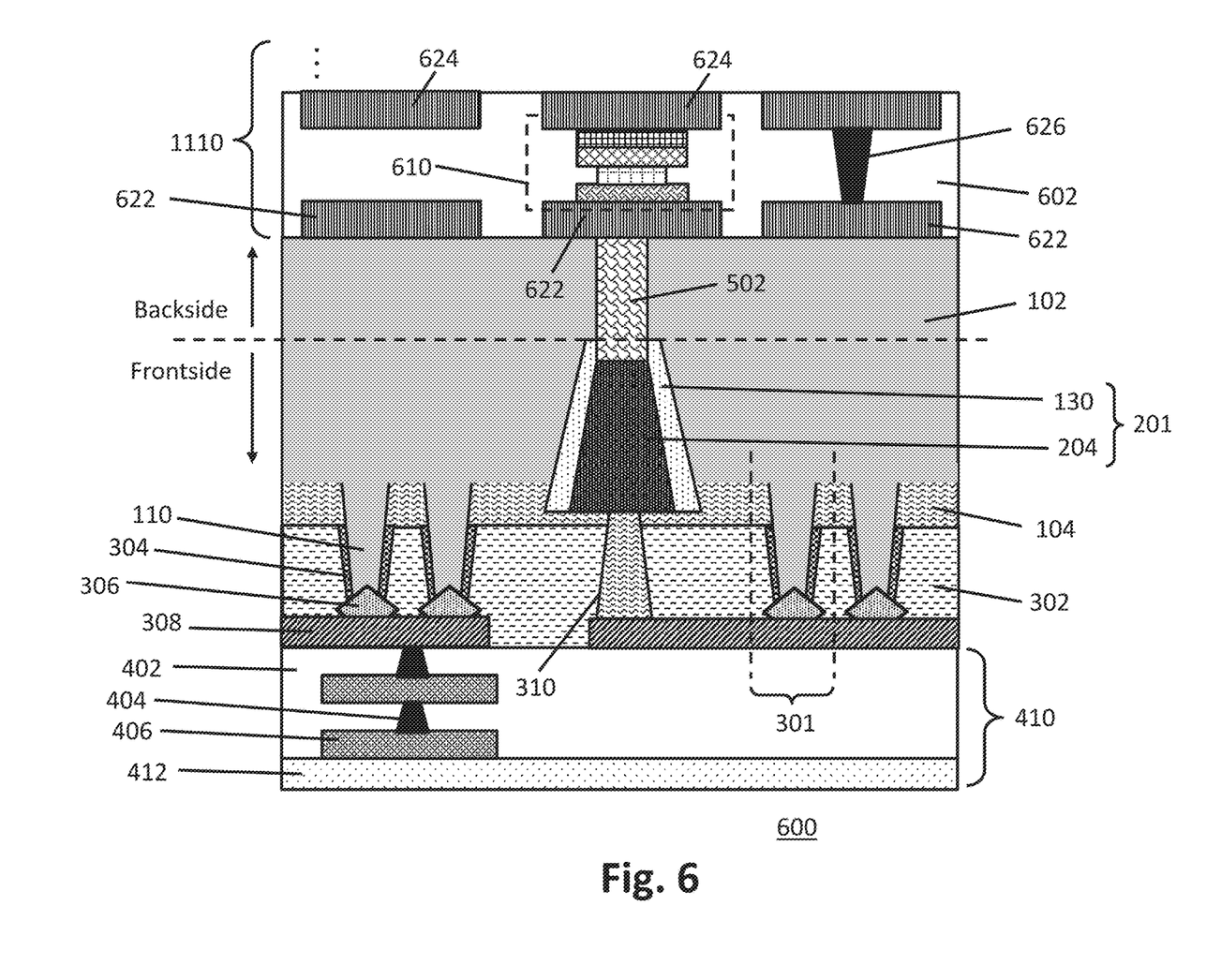
FIG. 6 is a cross sectional view of a structure 600 formed after forming a memory cell on a backside of a substrate of the exemplary structure of FIG. 5 in one embodiment.

FIG. 6 is a cross sectional view of a structure 600 formed after forming a memory cell on a backside of a substrate of the exemplary structure of FIG. 5 in one embodiment. In the example, shown in FIG. 6, a memory cell 610 can be formed on the backside of the substrate 102. The memory cell 610 can be an analog memory cell, such as memory cells that can store any analog value taken from a given range (e.g., instead of two binary values). Examples of analog memory can include, for example, phase change memory (PCM), resistive random access memory (RRAM), or other types of analog memory cell. The memory cell 610 shown in the example of FIG. 6 is a PCM cell. In one embodiment, a backside metal layer 622 can be deposited on the backside of the structure 500 shown in FIG. 5 (e.g., or on the backside of the substrate 102). The backside metal layer 622 can be connected to the TSV 502. The memory cell 610 can be formed on the backside metal layer 622. In one embodiment, other structures, such as an interconnect 626, can be formed on the backside metal layer 622 as well. A layer of dielectric materials 602 can be deposited to fill gaps between devices formed on the backside metal layer 622, such as the memory cell 610 and the interconnect 602. Another backside metal layer 624 can be formed on the devices formed on the backside metal layer 622, such as the memory cell 610 and the interconnect 602.

In the example shown in FIG. 6, current can flow between the memory cell 610 and the devices 301 through at least the backside metal layer 622, the TSV 502, the buried metal structure 201, the interconnect 310, and the frontside metal layer 308. As a result of forming the memory cell 610 on the backside of the substrate 102, and utilizing the TSV 502 and the buried metal structure 201 to facilitate current routing, a routing distance between the memory cell 610 and the devices 301 can be reduced when compared to aspects where memory cells and additional metal layers are formed on the frontside of the substrate 102. Further, the number of frontside metal layers in the BEOL region 410 can be reduced because the TSV 502 and the buried metal structure 201 can route current to and from the memory cell 610. The reduced frontside metal layers can lead to a reduction of an overall resistance of the structure 600, leading to relatively quicker read and write operations on the memory cell 610.

Figure 7A:
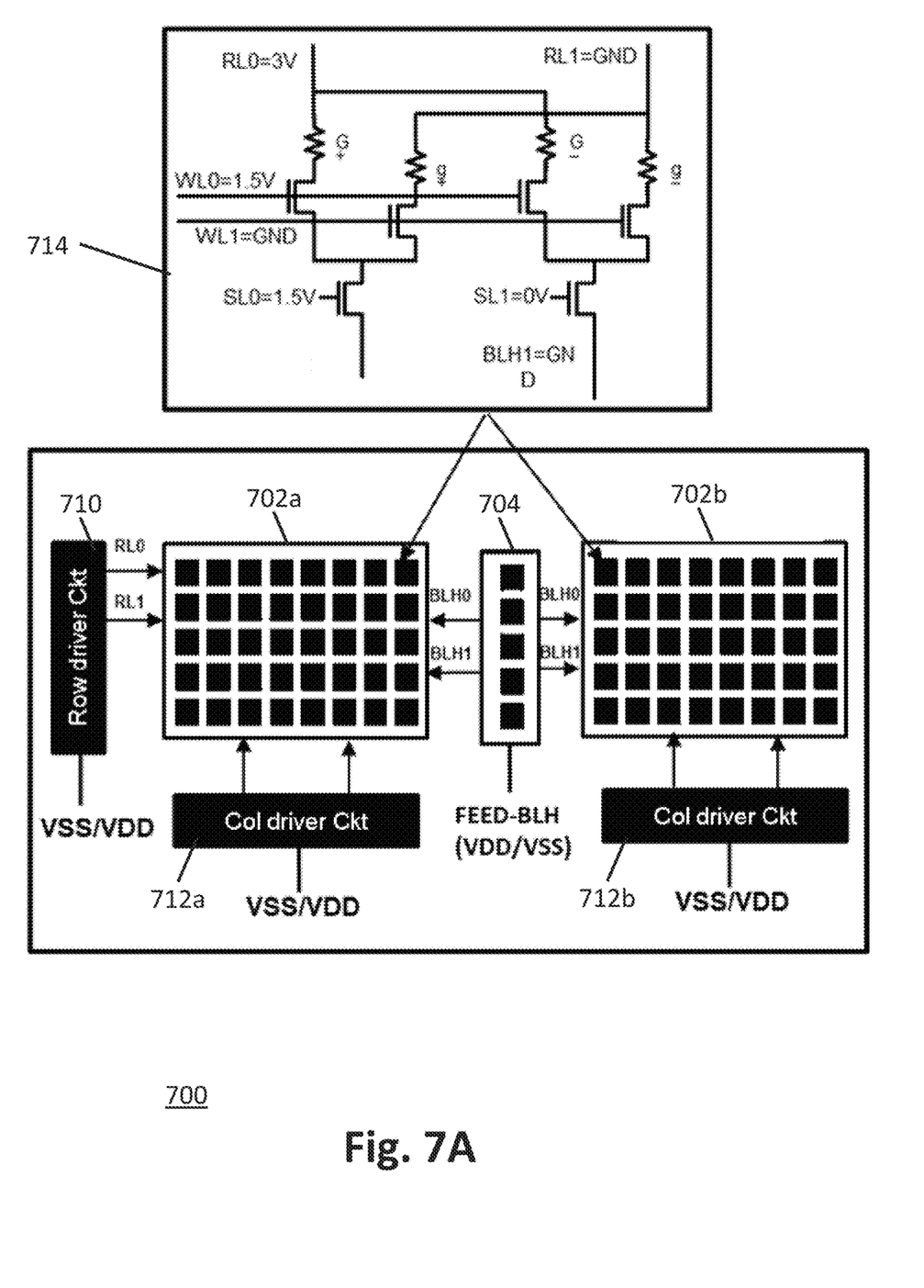
FIG. 7A is a diagram illustrating an example device that includes the structure of FIG. 6 in one embodiment.

FIG. 7A is a diagram illustrating an example device that includes the structure of FIG. 6 in one embodiment. A memory device 700 can include a row control circuit 710, a plurality of column control circuits such as column control circuits 712*a*, 712*b*, a plurality of memory arrays such as memory arrays 702*a*, 702*b*, and a shunt transistor block 704. The memory device 700 can include additional control circuits, memory arrays, and shunt transistor blocks not shown in FIG. 7A. The row control circuit 710 can be configured to activate one or more rows of memory cells in the memory arrays 702*a*, 702*b*, and other memory cells of the memory device 700. The column control circuits 712*a*, 712*b* can be configured to activate one or more columns of memory cells in the memory array 702*a*, 702*b*, respectively.

Each memory array (e.g., memory arrays 702*a*, 702*b*) can include a plurality of memory cells 714. In one embodiment, an example of the memory cell 714 can be the structure 600 shown in FIG. 6, where a memory cell is formed in a backside of a wafer or substrate. Reading or writing to the memory cells 714 of the memory arrays 702*a*, 702*b* can be achieved by applying an appropriate voltage or current to corresponding read lines and another appropriate voltage or current to corresponding bit lines to induce a current through the memory cells 714. The level and duration of the voltages or currents being applied is dependent upon the operation performed, such as a read operation or a write operation.

Figure 7B:
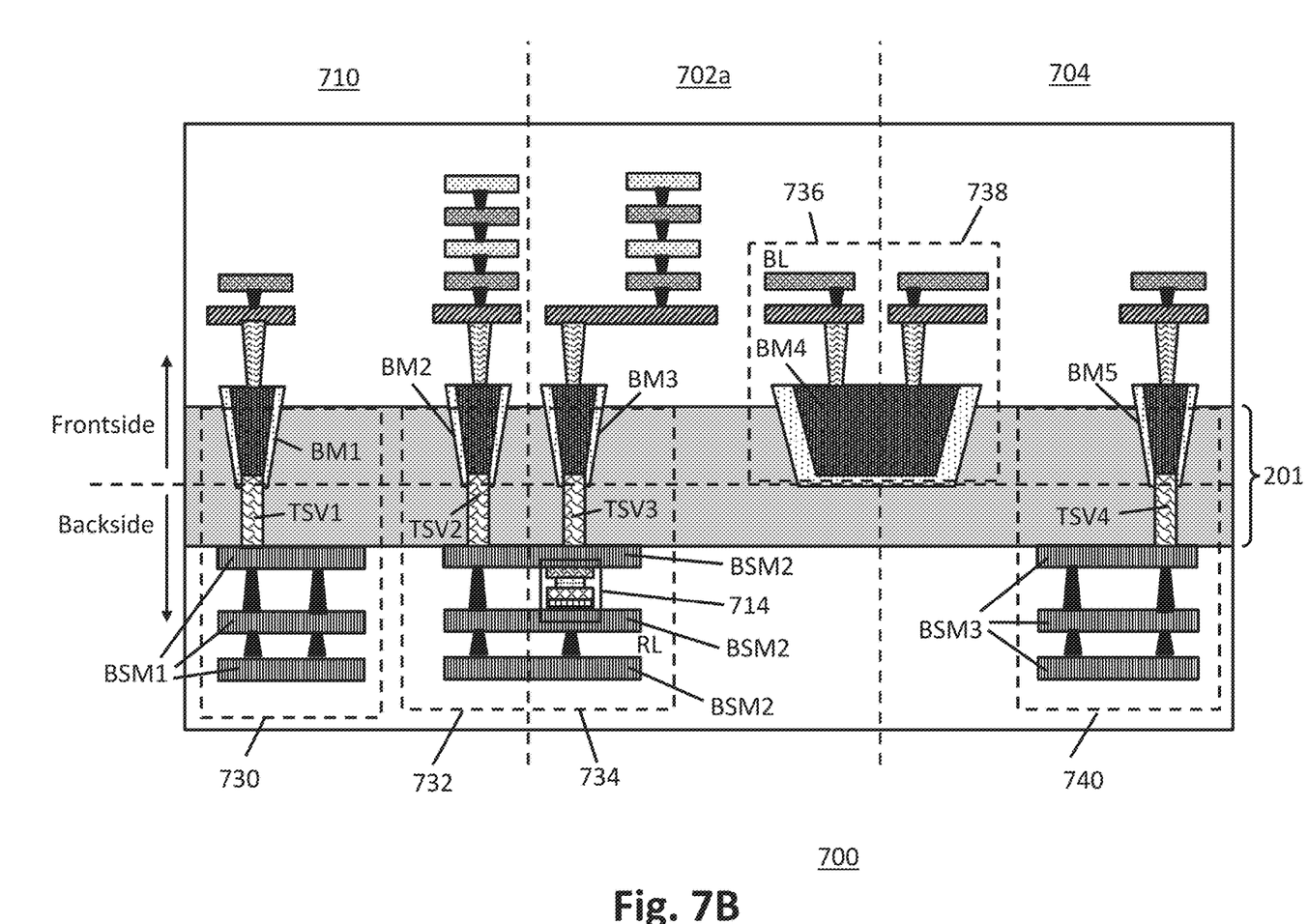
FIG. 7B is a diagram illustrating a cross sectional view of the example device of FIG. 7A in one embodiment.

An example cross sectional view of the memory device 700 is shown in FIG. 7B. The control circuit 710 can include a portion 730 and a portion 732. The portion 730 can include logic devices, interconnects, and frontside metal layers, on the frontside of the substrate 102. The logic devices on the frontside of the substrate 102 in the portion 730 can be connected to a buried metal structure (BM1). The buried metal structure BM1 can be inserted or formed in the substrate 102, though the frontside of the substrate 102. A TSV (TSV1) can be formed or inserted in the substrate 102, through the backside of the substrate 102. The buried metal structure BM1 can be connected to TSV1, and TSV1 can be connected to one or more backside metal layers and interconnects (BSM1) formed on the backside of the substrate 102. In one embodiment, the portion 730 can operate as a power deliver network for the memory device 700.

The portion 732 can include logic devices, interconnects, and frontside metal layers, on the frontside of the substrate 102. The logic devices on the frontside of the substrate 102 in the portion 732 can be connected to a buried metal structure (BM2). The buried metal structure BM2 can be inserted or formed in the substrate 102, though the frontside of the substrate 102. A TSV (TSV2) can be formed or inserted in the substrate 102, through the backside of the substrate 102. The buried metal structure BM2 can be connected to TSV2, and TSV2 can be connected to one or more backside metal layers and interconnects (BSM2) formed on the backside of the substrate 102.

The memory array 702*a* can include a portion 734 and a portion 736. The portion 734 can include logic devices, interconnects, and frontside metal layers, on the frontside of the substrate 102. The logic devices on the frontside of the substrate 102 in the portion 734 can be connected to a buried metal structure (BM3). The buried metal structure BM3 can be inserted or formed in the substrate 102, though the frontside of the substrate 102. A TSV (TSV3) can be formed or inserted in the substrate 102, through the backside of the substrate 102. The buried metal structure BM3 can be connected to TSV3, and TSV3 can be connected to the one or more backside metal layers and interconnects (BSM2) formed on the backside of the substrate 102. The portion 734 can include a memory cell 714 formed on a backside of the substrate 102. The connection of TSV2 and TSV3 to BSM2 can connect the control circuit 710 to the memory array 702. The backside metal layers and interconnects BSM2 on the backside of the substrate 102 in the portion 734 can be connected a read line RL (e.g., RL0, RL1 in FIG. 7A) of the memory device 700. A read operation performed by the memory device 700 can include reading data from the memory cell 714 through the read line RL and the backside metal layers and interconnects BSM2 on the backside of the substrate 102.

The portion 736 can include logic devices on the frontside of the substrate 102. The logic devices, interconnects, and frontside metal layers, on the frontside of the substrate 102 in the portion 736 can be connected to a buried metal structure (BM4). The buried metal structure BM4 can be inserted or formed in the substrate 102, though the frontside of the substrate 102. The logic devices, interconnects, and frontside metal layers on the frontside of the substrate 102 in the portion 736 can be connected a bit line BL (e.g., BLH0, BLH1 in FIG. 7A) of the memory device 700. A write operation performed by the memory device 700 can include writing data to the memory cell 714 through the bit line BL and the frontside metal layers and interconnects on the frontside of the substrate 102.

The shunt transistor block 704 can include a portion 738 and a portion 740. The portion 738 can include logic devices on the frontside of the substrate 102. The logic devices, interconnects, and frontside metal layers, on the frontside of the substrate 102 in the portion 738 can be connected to the buried metal structure (BM4). The connection of the logic devices, frontside metal layers and interconnects in the portion 738 to BM4 can connect the shunt transistor block 704 to the memory array 702a. In one embodiment, the shunt transistor block 704 can include additional copies of the portion 738 connected to other memory arrays (e.g., memory array 702b) of the memory device 700.

The portion 740 can include logic devices on the frontside of the substrate 102. The logic devices, interconnects, and frontside metal layers, on the frontside of the substrate 102 in the portion 740 can be connected to a buried metal structure (BM5). The buried metal structure BM5 can be inserted or formed in the substrate 102, though the frontside of the substrate 102. A TSV (TSV4) can be formed or inserted in the substrate 102, through the backside of the substrate 102. The buried metal structure BM5 can be connected to TSV4, and TSV4 can be connected to the one or more backside metal layers and interconnects (BSM3) formed on the backside of the substrate 102. The portion 740 can operate as a power deliver network for the shunt transistor block.

The memory device 700 shown in FIG. 7A and FIG. 7B is constructed based on a monolithic single wafer processing that forms a plurality of devices using the same wafer or substrate, instead of forming the devices on separate wafers and stacking them together. The buried metal structures and TSVs form in the substrate 102 can connect devices on the frontside of the substrate to the backside of the substrate. The formation of backside metal layers and memory cell on the backside of the substrate 102, along with the buried metal structures and TSVs in the substrate 102, can reduce the amount of metal layers and interconnects on the frontside of the substrate, and in the memory device 700. The reduced amount of metal layers and interconnects can reduce a size of the memory devices. For example, for each memory cell 714 in the memory arrays 702a, 702b, approximately two to four vias through the H1 line in the BEOL region can be removed, saving approximately 0.56 square micrometers of unit-cell footprint and enabling significant cell shrinkage. Further, the formation of the buried metal structures and the TSVs in the substrate 102, and the components on the frontside and the backside of the substrate, can be performed using heterogeneous integration. For example, relatively advanced technology can be used for forming logic devices on the frontside and relatively older technology can be used for forming memory cells on the backside.

Figure 8:
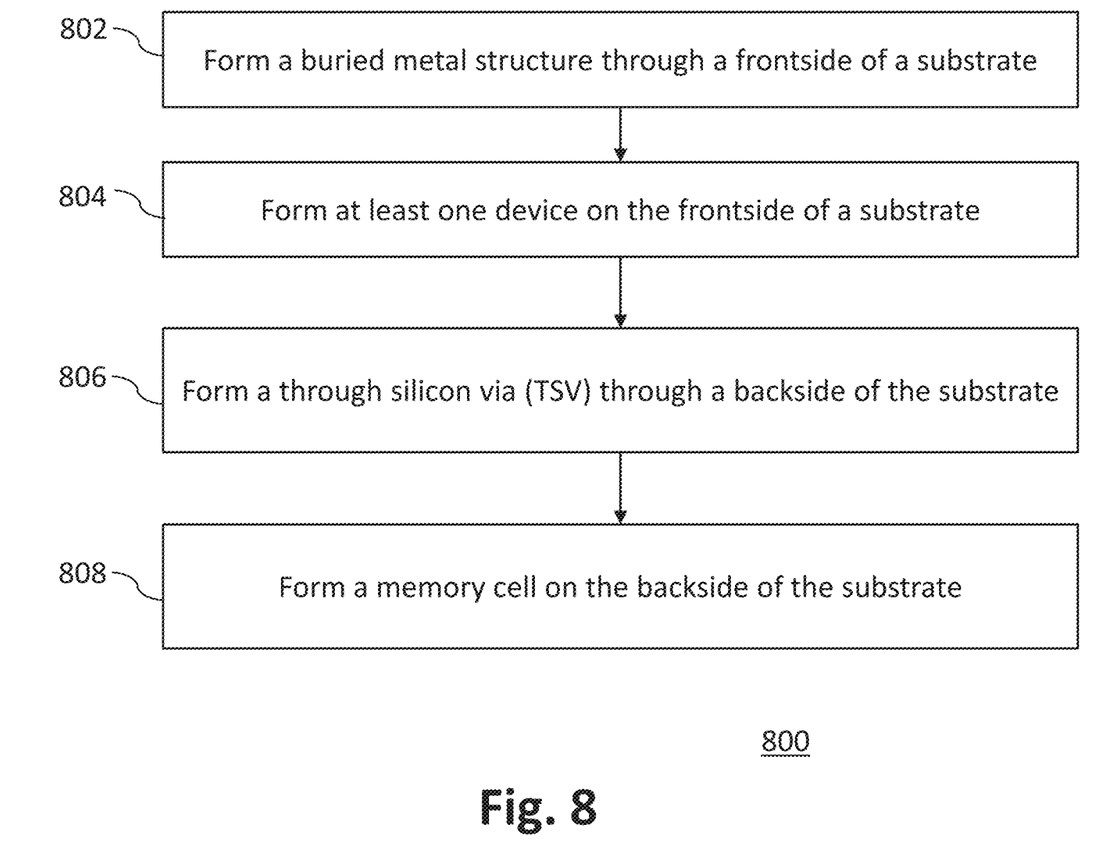
FIG. 8 is a flow diagram illustrating a method of forming memory cell in wafer backside in one embodiment.

FIG. 8 is a flow diagram illustrating a method of forming memory cell in wafer backside in one embodiment. An example process 800 may include one or more operations, actions, or functions as illustrated by one or more of blocks 802, 804, 806, and/or 808. Although illustrated as discrete blocks, various blocks can be divided into additional blocks, combined into fewer blocks, eliminated, performed in different order, or performed in parallel, depending on the desired implementation.

The process 800 can be performed to form a memory cell in a memory device. The process 800 can begin at block 802. At block 802, a buried metal structure can be formed in a substrate through a frontside of the substrate. In one embodiment, the buried metal structure can be composed of conductive materials, such as Cobalt (Co), Tungsten (W), Ruthenium (Ru) or other types of metal. The process 800 can proceed to block 804 from block 802. At block 804, at least one device can be formed on the frontside of a substrate. The at least one device can be connected to the buried metal structure in the substrate. In one embodiment, the at least one device can include at least one transistor. The process 800 can proceed to block 806 from block 804. At block 806, a through silicon via (TSV) can be formed in the substrate through a backside of the substrate. The TSV can be connected to the buried metal structure. In one embodiment, the TSV can be a nano-TSV.

The process 800 can proceed to block 808 from block 806. At block 808, a memory cell can be formed on the backside of the substrate, where the memory cell can be connected to the TSV. In one embodiment, the memory cell can be an analog memory cell. In one embodiment, the memory cell can be a phase change memory (PCM) cell. In one embodiment, one or more backside metal layers can be formed on the memory cell on the backside of the substrate to connect the memory cell to a read line of a memory device, and one or more frontside metal layers can be formed on the frontside of the substrate to connect the memory cell to a bit line of the memory device. In one embodiment, one or more back end of line (BEOL) metal layers can be formed on the frontside of the substrate.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more instructions for implementing the specified logical function(s). In some alternative implementations, the functions noted in the blocks may occur out of the order noted in the Figures. For example, two blocks shown in succession may, in fact, be performed substantially concurrently, or the blocks may sometimes be performed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising." when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A semiconductor structure comprising:
a substrate;
a memory cell formed on a backside of the substrate;
the substrate including:
   a buried metal structure connected to at least one device formed on a frontside of the substrate via an interconnect; and
   a through-silicon-via (TSV) connected to the buried metal structure and the memory cell formed on the backside of the substrate, wherein the interconnect spans from a frontside metal layer on a surface of the frontside of the substrate to the buried metal structure, the buried metal structure spans from the interconnect to the TSV, and the TSV spans from the buried metal structure to a surface of the backside of the substrate.

2. The semiconductor structure of claim 1, wherein the memory cell is an analog memory cell.

3. The semiconductor structure of claim 1, wherein the memory cell is a phase change memory (PCM) cell.

4. The semiconductor structure of claim 1, wherein the buried metal structure is composed of one of Cobalt (Co), Tungsten (W), Ruthenium (Ru).

5. The semiconductor structure of claim 1, wherein the TSV is a nano-TSV.

6. The semiconductor structure of claim 1, wherein the at least one device includes at least one transistor.

7. The semiconductor of claim 1, wherein:
the memory cell is connected to a backside metal layer that connects to a read line of a memory device; and
the frontside metal layer is form on a frontside of the substrate, the frontside metal layer being connected to a bit line of the memory device.

* * * * *